United States Patent [19]

Kruit et al.

[11] Patent Number: 4,977,324
[45] Date of Patent: Dec. 11, 1990

[54] CHARGED PARTICLE BEAM APPARATUS

[75] Inventors: Pieter Kruit, Delft; Karel D. Van Der Mast, Eindhoven, both of Netherlands

[73] Assignee: U.S. Philips Corporation, New York, N.Y.

[21] Appl. No.: 344,196

[22] Filed: Apr. 27, 1989

[30] Foreign Application Priority Data

May 9, 1988 [NL] Netherlands ............... 8801208

[51] Int. Cl.[5] ............................................. H01J 3/20
[52] U.S. Cl. .......................... 250/396 ML; 250/396 R
[58] Field of Search ................... 250/396 ML, 396 R

[56] References Cited

U.S. PATENT DOCUMENTS

| | | | |
|---|---|---|---|
| 4,330,709 | 5/1982 | de Chambost | 250/396 ML |
| 4,376,249 | 3/1983 | Pfeiffer et al. | 250/396 ML |
| 4,544,846 | 10/1985 | Langner | 250/396 ML |
| 4,564,763 | 1/1986 | Bruel et al. | 250/396 ML |
| 4,701,623 | 10/1987 | Beasley | 250/396 ML |

Primary Examiner—Jack I. Berman
Assistant Examiner—Kiet T. Nguyen
Attorney, Agent, or Firm—Paul R. Miller

[57] ABSTRACT

A Variable Axis Lens system comprises at least two lenses which are arranged to be radially offset with respect to an optical axis of the apparatus. Because the lenses do not contain iron, the occurrence of disturbing eddy currents can be prevented. The lenses for axis displacement are preferably constructed as single ring conductors, a number of which can be readily arranged in one plane in a partly overlapping fashion. Such a system can also be arranged behind the object. For the lenses for axis displacement use is preferably made of a ceramic superconducting material having a comparatively high temperature coefficient and a comparatively high specific heat in the superconducting phase, so that they can be simply cooled from the outside.

19 Claims, 1 Drawing Sheet

CHARGED PARTICLE BEAM APPARATUS

The invention relates to a charged particle beam apparatus, comprising a particle source, a particle optical device and a Variable Axis Lens system.

An apparatus of this kind in the form of an electron beam writer is described in Journal Vac. Sci. and Technology (19), Nov.–Dec. 1981, pp. 1058–1063. Using a variable axis lens (VAL) system, the optical axis of a particle beam can be laterally displaced across a comparatively large surface of an object to be irradiated without deterioration of spot shaping and without giving rise to disturbing errors. Beam scanning accompanied by displacement of the optical axis is attractive, for example, for inscribing an object as well as for inspecting an object. Optical errors are reduced by this system and electrons to be detected from an object can be carried off in a better oriented manner. Such carrying off takes place to, for example an electron detector which is situated at an opposite side of the lens with respect to the object, the electrons to be detected, for example secondary electrons or Auger electrons, traversing the lens field before detention.

An apparatus based on this principle is disclosed in Netherlands application No. NL 8602196, in the name of Applicant corresponding to U.S. patent application Ser. No. 089,092, filed Aug. 25, 1987.

Notably in the case of strong lens fields, desirable for many applications in such apparatus, there exists a drawback in that the coils for displacing the axis must be energised to such an extent that the development of heat therein becomes a factor which exerts a limiting effect. Moreover, in the case of fast deflection disturbing circular currents occur in the ferromagnetic pole shoes used for generating locally strong fields. This limits the scanning speed. The scanning fields is limited in that errors occur which increase as the displacements are larger. Moreover, the VAL coils have a complex construction which is liable to cause deviations in the field distributions.

It is the object of the invention to remove these limitations; to achieve this, a charged particle beam apparatus of the kind set forth in accordance with the invention is characterized in that the variable axis lens system comprises at least two iron-free lenses which are arranged so as to be radially offset with respect to one another.

Because a VAL system in accordance with the invention utilises simple, iron-free VAL coils, the above drawbacks are substantially mitigated and, for example higher scanning frequencies can also be used because no eddy currents can occur in pole shoes. The dimensions of the system may also be smaller while at the same time the degree of lateral beam displacement is at least maintained, Because of the smaller dimensions and the absence of disturbing circular currents, locally higher field strengths can be realised while maintaining or even improving the lens quality and very fast field variations can be used without objection.

Additional advantages of a system in accordance with the invention inter alia consist in that for each lens of the VAL system there exists a beam position for which no deflection errors occur, i.e. a position coincident with the optical axis of the lens. Thus, a compromise can be made between the magnitude of the scanning field per lens and the maximum deflection errors then occurring. Control is realised by re-distribution of the current among the various lenses. The total current may then in principle remain the same. Through-the-lens detection as in known VAL systems can also be performed.

In a preferred embodiment, the variable axis lens system comprises at least two ring conductors which are arranged in a plane transversely of the optical axis of the system. By varying the current intensity in the ring conductors with respect to one another, the optical axis can be displaced. There is notable included an array of ring conductors, so that a large scanning field can be covered without using substantial deflection. For correct passage of an electron beam across the current conductors there may be provided a pre-deflection device which "looks" as if it were around the current conductors. The necessity of "looking around" the current conductors can be avoided by arranging the current conductors in the form of rings or coils underneath the object space. Even though only a part of the lens field is then effectively used, this need not be objectionable, particularly when use is made of superconducting current circuits of the high energising level which may occur therein. This solution is less suitable for objects which shield the magnetic lens field. Notably when use is made of a matrix of superconducting coils or rings, this solution may be very attractive.

In a further preferred embodiment, coils for the displacement of the optical axis are constructed so that they can be energised by means of superconducting current conductors. The coils for displacing the axis can then be cooled, for example via a main coil, to a temperature at which the current conductors are superconductive. It is particularly attractive to make these superconducting current conductors of a material which combines a comparatively high transition temperature with a heat coefficient which is also comparatively high in the superconducting state, for example superconducting ceramic materials. Notably in that case the cooling can be applied from outside a lens housing, for example from an external cooling reservoir or refrigerator. From such a unit cooling of the current conductors can be realised by means of suitable heat conductors passing through the wall of the housing. Because of the high heat coefficient a small supply of heat will not readily cancel the superconducting state.

In a further preferred embodiment, a main lens itself is formed by, for example two closed superconducting current circuits which are situated in a plane transversely of tha axis of the optical system. The optical axis can be displaced therein by varying the current ratio of these two coils.

Some preferred embodiments in accordance with the invention will be described in detail hereinafter with reference to the drawing.

Therein:

Figure 1:
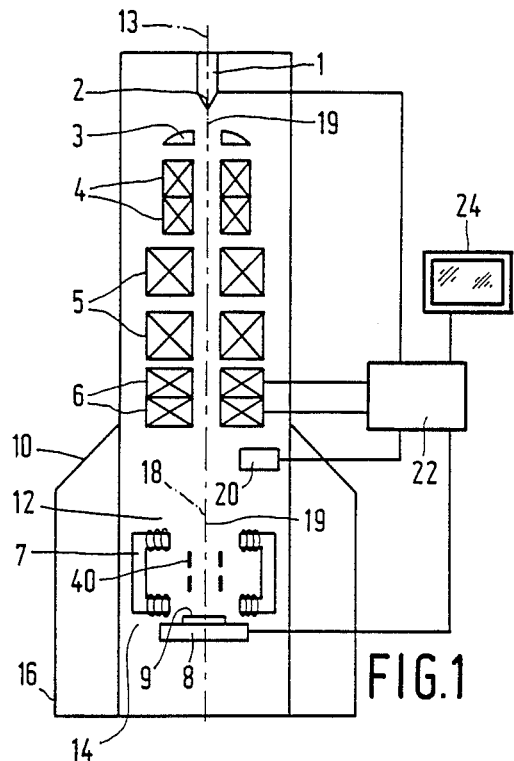
FIG. 1 shows an apparatus in accordance with the invention which is constructed as an electron detection device.

An electron beam apparatus as shown in FIG. 1 comprises an electron source 1, for example comprising a semiconductor electron emitter 2, an anode 3, a beam alignment system 4, a condensor lens 5, a beam scanning system 6, and a variable axis lens system 7. Together with a carrier 8 for an object 9 all the elements are accommodated in a housing 10 which comprises a measuring space 12 and an object space 14. The housing is sealed by means of a vacuum-tight wall 16. In the object space there may be arranged an externally operable mechanism for object displacement and possibly object rotation and tilting. For inspection of, for example a chip, there may be included facilities for arranging the chip on the object carrier from the outside. For detection of electrons emerging from the object upon interaction with an electron beam 18 incident thereon there is included a detector 20, for example a secondary electron detector. The electron beam extends along an optical axis 19 of the apparatus. The scanning coils 6, the electron source 1, the object carrier 8 and the detector 20 are connected to a central control device 22 whereto a television monitor 24 is connected for image display or spectrum display; however, for example a digital signal processing system, a hard copy unit and a writer can also be connected thereto.

Figure 2:
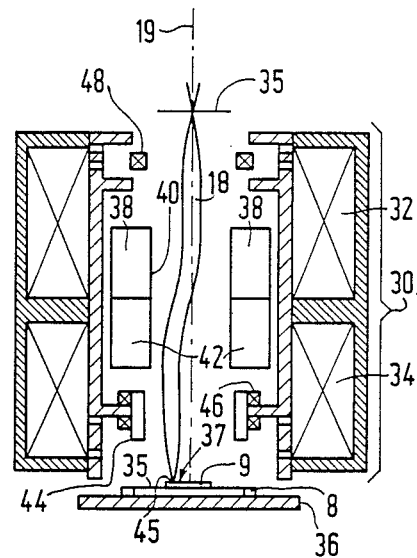
FIG. 2 shows a known variable axis lens system.

A know VAL system as shown in FIG. 2 comprises a main lens 30 with first coil 32 and a second coil 34 which together form a telemetric lens for imaging an object plane 35 in a focal plane 37 which coincides with the surface of an object 9. A pole shoe 36 of the system acts as if it were a mirror for the lines of force of the lens system. In this configuration the object is situated in a field space of the lens. Inside the coils 32 and 34 there is arranged a deflection system 40 which comprises a first coil 38 and a second coil 42 which together can display the beam 18 in the tranverse direction over, for example approximately 5 mm, taken from the geometrical axis 19 of the system. At the area where the deflected electron beam 18 extends parallel to the system axis 19 again there is arranged a variable axis coil 44 whereby the optical axis is displaced as the electron beam is displaced. A target 45 of the beam on the object, therefore, always constitutes the point of intersection of the optical axis with the surface of the object. For correction the system may also include dynamic focus coils 46 and stigmator coils 48. When all coils are energised in a synchronised manner in such a system, the optical axis of the system is always displaced together with the beam 18. A comparative large field, for example a square having a rib of 10 mm or a circle having a diameter of 10 mm can thus be covered by the beam, without giving rise to image errors which become greater as the distance from the system axis 19 increases. Errors of a preceding optical system are compensated for.

Even though this system offers many advantages, limitations exist notably in the case of strong lens fields which are very desirable, for example, for chip inspection, for spectroscopic measurements, for Auger detection etc.; this is notably because of an excessive development of heat in the various coils and because of the eddy currents occurring in the pole shoes, which is notably so in the case of quickly alternating fields (scanning). The thermal limitations can be reduced by shielding the pole shoes of the main lens by means of a superconducting eddy current shield, so that at least the disturbing dynamic nature thereof is eliminated. Constant circular currents generated therein can be readily pre-compensated for. The coils for axis displacement are then arranged between the shielded pole shoes of the main lens and can provide displacement of the axis as well as dynamic stigmation and dynamic focussing.

Figure 3:
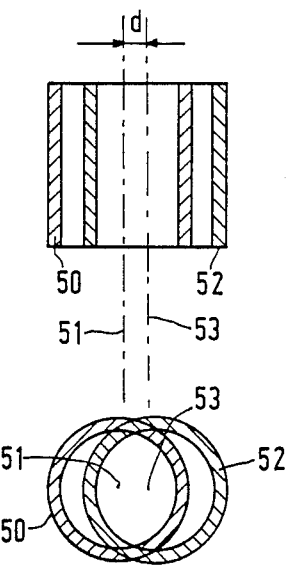
FIG. 3 shows a variable axis lens system in accordance with the invention, comprising magnet coils with current conductors made of a superconducting material

FIG. 3 shows a lens system for axis displacement which is composed of a few (in this case two) superconducting current circuits 50 and 52 which are oriented in a plane transversely of an optical axis 51, even though beam deflection is concerned. From an optical point of view, a first coil 50 may be considered to be a simple lens having an optical axis extending through the center of the ring. A second coil 52 is in principle identical to the first coil, but is arranged so as to be shifted over a distance d in the radial direction with respect thereto, so that an optical axis 53 thereof is situated parallel to the optical axis, again at a distance d therefrom. By variation of the current intensity therein, the optical axis can be displaced parallel to itself, for example across at least a region enclosed by the two coils. By suitable variation of the current intensities through the coils, the total lens strength can be maintained, for example so as to be constant.

In the described embodiment current turns of both coils are intermingled; this may give rise to problems and in any case makes the construction comparatively complex.

Figure 4:
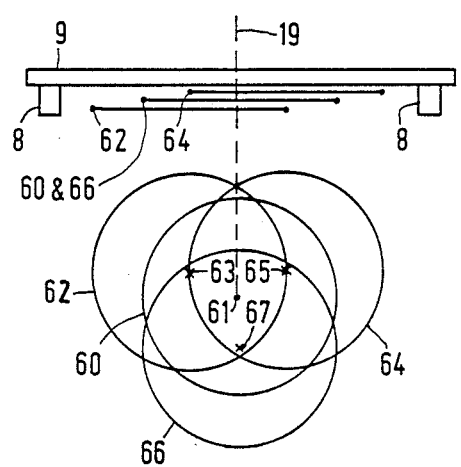
FIG. 4 shows a variable axis lens system in accordance with the invention, comprising ring shaped current conductors of a superconducting material for displacement of the axis.

This drawback is avoided in a lens system for axis displacement as shown in FIG. 4 in that single ring conductors are used instead of coils. The system shown comprises four ring conductors 60, 62, 64 and 66 having centers 61, 63, 65 and 67, respectively. The center 61 is situated on an optical axis 19 of the entire system and the centers 63, 65 and 67 are situated at equal distances therefrom and enclose angles of 120° with respect to one another. Like in the example shown in FIG. 3, the optical axis can be displaced again by current distribution variation between the rings. The sum current and hence the total lens strength can again be kept constant. The latter can also be realised so that the central ring 60 carries a comparatively strong current and constitutes tha actual lens, the other three coils being activated in a varying manner. The largest geometrical advantage is obtained when the transverse dimension of the current conducting rings is comparatively small. This is because notably in that case the rings can be positioned in substantially one plane. When the cross-section is comparatively small, the current load for the ring conductors becomes comparatively high for a given lens excitation. Therefore, the current conductors are preferably made of a superconducting material. In that case the current conductor 60 can carry, as a central ring a persistent current and the other rings can carry an externally applied variable superconducting current.

The system of current conducting rings will usually be arranged in front of an object to be examined, a return beam also passing through the system upon detection. It may then be a drawback that predeflection is required for the passing of the conductors. This drawback can be avoided by arranging the ring system behind the object. The fact that only a part of the lens field is then effectively used, is one more reason why the current conductors are preferably made of a superconducting material.

It will be apparent that a larger scanning field can be realised when more rings are used and that a new compromise can be made between permissible deflection errors and the number of rings. In the case of a comparatively small scanning field, the rings may be included in a central lens, for example the objective lens of an electron microscope comprising an iron circuit.

A ring conductor can also be constructed so that it can be displaced for scanning in a plane parallel to the object surface, i.e. perpendicular to the optical axis of the system, thus realising a two-stage scan with a coarse mechanical scan and for each mechanical scanning field an elecromagnetic sub-scan by means of a ring system. The object motion (wafer motion for chip production) can then be dispensed with or be reduced to a few steps.

A superconducting VAL system can also be realised by displacing a superconductor, using a controllable potential, in a superconducting plate, comprising a central diaphragm, in the plane of the plate. Notably in this construction it is attractive to arrange the lens system behind the object or to arrange the plate so as to be mechanically displaceable in a multi-stage scanning system.

Superconducting coils and current circuits can be cooled, for example by means of a cooling device or cooling reservoir which is mounted around these components at a comparatively short distance therefrom. To this end, use can be made of the space which is saved because of the small dimensions and the omission or iron yokes. It may be attractive to use current supply leads as cooling conductors. Notably when ceramic superconducting materials are used for current conductors, external cooling is readily possible because of the high transition temperature and the comparatively high heat coefficient thereof, the cold being applied to the lenses via a cooling medium flow or cold conductors.

We claim:

1. A charged particle beam apparatus comprising:
   (a) source means for providing charged particles,
   (b) charged particle optical means for controlling displacement of said charged particles,
   (c) Variable Axis Lens (VAL) means for transversely displacing an optical axis of said charged particles, said VAL means including at least two iron-free lenses arranged radially offset with respect to one another, and
   (d) carrier means for carrying an object receiving a beam of said charged particles.

2. A charged particle beam apparatus according to claim 1, wherein said iron-free lenses are coils arranged radially one in the other, said coils having axes parallel to said optical axis.

3. A charged particle beam apparatus according to claim 2, wherein said iron-free lenses include current conductors of superconducting material.

4. A charged particle beam apparatus according to claim 1, wherein said VAL means includes a plurality of single ring conductors, said plurality of ring conductors being arranged in a plane transverse to said optical axis.

5. A charged particle beam apparatus according to claim 4, wherein sid plurality of ring conductors are disposed with centers arranged at displaced ones of said optical axes, one of said ring conductors being centered at an original optical axis and the remaining ring conductors being disposed about said original optical axis.

6. A charged particle beam apparatus according to claim 5, wherein said ring conductors are of superconducting material.

7. A charged particle beam apparatus according to claim 6, wherein said plurality of ring conductors are disposed after said object in the direction of travel of said charged particles.

8. A charged particle beam apparatus accorging to claim 6, wherein said superconducting material is a ceramic superconducting material having a high specific heat in a superconducting phase.

9. A charged particle beam apparatus according to claim 4, further comprising means for displacing said plurality of ring conductors, wherein said ring conductors scan in a plane parallel to a surface of said object.

10. A charged particle beam apparatus according to claim 1, wherein said VAL means include imaging lenses of said charged particle optical means.

11. A charged particle beam apparatus according to claim 1, wherein said VAL means includes at least one superconducting coil in a closed current circuit of superconducting material, and wherein means for energizing said superconducting material by a persistent current are included.

12. A charged particle beam apparatus according to claim 11, further comprising cooling means for cooling said superconducting circuit, wherein said cooling means are disposed adjacent the apparatus.

13. A charged particle beam apparatus according to claim 11, further comprising cooling means for cooling said superconducting coil, wherein said cooling means includes a cooling resevoir and thermally conductive connection means for connecting said superconducting coil to said cooling reservoir.

14. A charged particle beam apparatus according to claim 11, wherein said superconducting material is a ceramic superconducting material having a high specific heat in a superconducting phase.

15. A charged particle beam apparatus according to claim 11, wherein said VAL means includes a plate of superconducting material for generating a displaceable circular current.

16. A charged particle beam apparatus according to claim 11, wherein said VAL means are mechanically displaceable with respect to said object.

17. A charged particle beam apparatus according to claim 11, said VAL means are disposed after said object in the direction of travel of said charged particles.

18. A charged particle beam apparatus according to claim 11, wherein said VAL means provides a constant total current intensity.

19. A charged particle beam apparatus according to claim 11, wherein said VAL means includes a lens element centrally disposed about said optical axis, said lens element being energized by a persistent superconducting current.

* * * * *